United States Patent [19]
Takahashi

[11] Patent Number: 5,874,774
[45] Date of Patent: Feb. 23, 1999

[54] FLAT PACKAGE SEMICONDUCTOR DEVICE

[75] Inventor: Yoshikazu Takahashi, Nagano, Japan

[73] Assignee: Fuji Electric Co., Ltd., Japan

[21] Appl. No.: 768,244

[22] Filed: Dec. 17, 1996

[30] Foreign Application Priority Data

Dec. 18, 1995 [JP] Japan ................................ 7-328462

[51] Int. Cl.⁶ .................. H01L 23/043; H01L 29/78; H01L 23/42
[52] U.S. Cl. .................. 257/688; 257/685; 257/723; 257/689; 257/726; 257/178; 257/181
[58] Field of Search .................... 257/723, 188, 257/181, 177, 178, 180, 182, 179, 139, 688, 144, 726, 785, 341, 378, 584, 689, 698

[56] References Cited

U.S. PATENT DOCUMENTS

| | | | |
|---|---|---|---|
| 4,719,500 | 1/1988 | Tokunoh | 257/182 |
| 4,882,612 | 11/1989 | Usui et al. | 257/151 |
| 4,918,514 | 4/1990 | Matsuda et al. | 257/623 |
| 4,996,586 | 2/1991 | Matsuda et al. | 257/726 |
| 5,006,921 | 4/1991 | Ishizuka | 257/717 |
| 5,043,795 | 8/1991 | Takahashi et al. | 257/182 |
| 5,121,189 | 6/1992 | Niwayama | 257/688 |
| 5,189,509 | 2/1993 | Satoh et al. | 257/718 |
| 5,371,386 | 12/1994 | Tokunoh et al. | 257/181 |
| 5,539,220 | 7/1996 | Takahashi et al. | 257/177 |
| 5,563,076 | 10/1996 | Takahashi | 438/15 |
| 5,610,439 | 3/1997 | Hiyoshi et al. | 257/688 |
| 5,635,427 | 6/1997 | Takahashi | 438/107 |
| 5,669,546 | 9/1997 | Kirihata | 228/123.1 |

FOREIGN PATENT DOCUMENTS 08162579A 6/1996 Japan.

*Primary Examiner*—Tom Thomas
*Assistant Examiner*—Alexander Oscar Williams
*Attorney, Agent, or Firm*—Rossi & Associates

[57] ABSTRACT

A semiconductor device is provided which includes a plurality of semiconductor chips each of which has a first main electrode and a control electrode on a first main surface and a second main electrode on a second main surface, and a plurality of support plates each of which is secured to the second main surface of the corresponding semiconductor chip. These semiconductor chips and support plates constitute individual semiconductor elements. The semiconductor elements are accommodated in the flat package that includes first and second common electrode plates and an insulating sleeve interposed between the common electrode plates, such that the semiconductor chip and the support plates are positioned by positioning guides. The first common electrode plate is in contact under pressure with the support plates. The semiconductor device further includes a plurality of contact terminal blocks each of which is disposed between the second common electrode and the first main electrode of the corresponding semiconductor chip so as to apply a pressure to the semiconductor chip and serve as a conductor and a heat radiator.

8 Claims, 2 Drawing Sheets

FLAT PACKAGE SEMICONDUCTOR DEVICE

FIELD OF THE INVENTION

The present invention relates to a semiconductor device wherein a plurality of insulated gate bipolar transistors (IGBT), for example, are incorporated in the same flat package.

BACKGROUND OF THE INVENTION

Insulated gate bipolar transistors (IGBT) have been widely used, for example, as power switching devices in the application of motor PWM control inverters. The insulated gate bipolar transistor, which is of voltage driven type, can be easily handled in use, and has been thus required to have a large capacity to meet the needs of the market. In this situation, a module structure has been employed in which a plurality of IGBT chips are integrated within the same package.

In a MOS control type device, such as IGBT, an emitter electrode and a gate electrode are formed side by side on the main surface of a semiconductor chip. Where such IGBT are incorporated into a package, a collector electrode formed on the lower surface of the semiconductor chip is mounted on a support plate that is a metal base serving also as a heat radiator, and this support plate can be used as an external lead-through terminal for the collector electrode. The emitter electrode and gate electrode, on the other hand, need to be connected to corresponding external lead-through terminals through respective bonding wires. Since the bonding wire generally consists of an aluminum wire having a diameter of about 300 $\mu$m, heat is scarcely dissipated from one side of the chip which bears the emitter electrode, and mostly dissipated from the other side of the chip which bears the collector electrode. Further, the internal wiring of this device has a large inductance.

To solve the above problems, a pressure contact type IGBT has been proposed that is mounted in a flat package having a ceramic insulating sleeve, similarly to a conventional thyristor or GTO thyristor. Since the IGBT is different from the GTO thyristor in that its main surface on which the emitter electrode is formed has a MOS structure, unlike the GTO thyristor, there arises a need to provide a collecting electrode in a region other than this MOS structure and apply the pressure to this region, so as to assure electric characteristics and long-term reliability of the transistor.

With regard to the pressure contact type IGBT, a plurality of semiconductor chips are secured by soldering to the same support plate (metal base) while being positioned by positioning guides. The collecting electrode of each semiconductor chip contacts under pressure with the upper common electrode through a corresponding contact terminal block. The positioning guide formed of fluorine resin, for example, is used for positioning this contact terminal block and the semiconductor chip.

In the above-described known structure using wire bonding, however, the current capacity of the element is considerably limited since heat is hardly dissipated from the emitter-electrode side of the transistor though the collector-electrode side of the transistor undergoes heat dissipation. In the element having a large current capacity, the number of bonding wires connected to the emitter electrode is increased, and reaches several hundreds particularly when a plurality of IGBT are accommodated in the same package to provide a module. In this case, the internal wiring has an increased inductance, which may cause a large surge upon a switching operation of the IGBT, and also cause a problem of reduced operating reliability.

In an attempt to solve the problems of heat dissipation, inductance of the internal wiring and others in the above-described known structure, it is proposed to incorporate the IGBT into a flat package, similarly to a flat semiconductor device such as a GTO thyristor, and draw the emitter electrode and collector electrode formed on the opposite major surfaces of each IGBT to respective common electrode plates exposed to the upper and lower surfaces of the flat package. In this structure wherein the emitter electrode of each semiconductor chip extends over an insulating layer covering the gate electrode, however, there may arise stresses in the MOS structure due to application of pressure thereto when the common electrode plate on the side of the flat package comes into contact under pressure with the emitter electrode. The thus produced semiconductor chip cannot be used in practice as it is.

In view of the above, a structure called a collecting electrode that serves as current path and heat radiator and does not have a MOS structure is provided on the emitter-electrode side of the IGBT. The contact terminal block that is accurately positioned by means of the positioning guide is brought into contact with this collecting electrode portion, so that the stress due to the pressure is not applied to the MOS structure where the emitter electrode is present. Thus, the semiconductor chip and contact terminal block are accurately positioned by the positioning guide without any shift therebetween in the lateral direction. In the known flat type IGBT wherein collector electrodes of a plurality of semiconductor chips are soldered under pressure to the same support plate, however, only one of the semiconductor chips cannot be replaced by another one even if the semiconductor chip is found defective after assembling of the chips with the flat package, thus causing a problem of considerably increased manufacturing cost of the semiconductor device. For example, a semiconductor device in which 12 semiconductor chips are combined together becomes defective if only one of these semiconductor chips becomes defective after assembling.

SUMMARY OF THE INVENTION

The object of the present invention is to provide a semiconductor device in which a common support plate (metal base) to which a plurality of semiconductor chips are secured in the known device is separated into individual support plates for respective semiconductor chips, to produce semiconductor elements in which the individual support plates are secured to the respective semiconductor chips, so that if a defective semiconductor element appears, only the defective semiconductor element can be replaced by a good or non-defective semiconductor element, assuring a high yield of the semiconductor device in which a plurality of semiconductor elements are integrated.

To attain the above object, there is provided a semiconductor device comprising: a plurality of semiconductor chips each of which has a first main electrode and a control electrode on a first main surface and a second main electrode on a second main surface; a plurality of support plates each of which is secured to the second main surface of a corresponding one of the semiconductor chips, the semiconductor chips and the support plates constituting individual semiconductor elements, a flat package comprising first and second common electrode plates and an insulating sleeve interposed between the common electrode plates, the semiconductor elements being accommodated in the flat package such that the semiconductor chips and the support plates are positioned by positioning guides, the first common electrode plate being in contact under pressure with the support plates; and a plurality of contact terminal blocks each of which is disposed between the second common electrode and the first main electrode of the corresponding semiconductor chip, so as to apply a pressure to the corresponding semiconductor chip and serve as a conductor and a heat radiator.

According to the present invention, the semiconductor device with a large capacity is produced by integrating a plurality of semiconductor elements having individual collector electrodes along with the contact terminal blocks formed on the side of the emitter electrodes of the elements. When a defective is found among the semiconductor elements stored in the package, therefore, only the defective can be easily replaced by a normal or non-defective element. This leads to a considerably increased yield of the semiconductor device and significantly reduced manufacturing cost, as compared with the case where defect in one semiconductor element results in defect in the whole semiconductor device.

In the semiconductor device as described above, the semiconductor elements and the contact terminal blocks are preferably positioned by the positioning guides. The positioning guides may be formed of heat-resistant plastic. This heat-resistant plastic may be a liquid crystalline polymer or polyimide resin. The semiconductor device may further include a binder applied between the second main electrode of each semiconductor chip and the corresponding support plate. The thickness of this binder is controlled so that the plurality of semiconductor elements accommodated in the flat package have the same thickness as measured as a distance between a surface of the first main electrode of each semiconductor chip and a surface of the corresponding support plate. When a defective semiconductor element is replaced by a non-defective semiconductor element, in particular, the thickness of the binder applied between the second main electrode and the corresponding support plate is preferably controlled so that a thickness of the non-defective semiconductor element that replaces the defective semiconductor element becomes equal to that of other non-defective semiconductor elements. The above-indicated flat package may comprise a frame in which a gate finger is formed, and the positioning guides are accurately positioned within the frame.

The semiconductor chip having the first main electrode and the control electrode on the first main surface and the second main electrode on the second main electrode may be selected from an insulated gate bipolar transistor, a MOS control thyristor and a MOS transistor. The semiconductor device may further include at least one flywheel diode that is incorporated in the flat package and disposed in parallel with the plurality of semiconductor chips, and at least one contact terminal block disposed between the second common electrode and an anode electrode of each flywheel diode so as to apply a pressure to the flywheel diode(s) and serve as a conductor and a heat radiator.

BRIEF DESCRIPTION OF THE DRAWINGS

The invention will be described in greater detail with reference to a certain preferred embodiment thereof and the accompanying drawings, wherein.

DETAILED DESCRIPTION OF THE PREFERRED EMBODIMENT

Figure 1A:
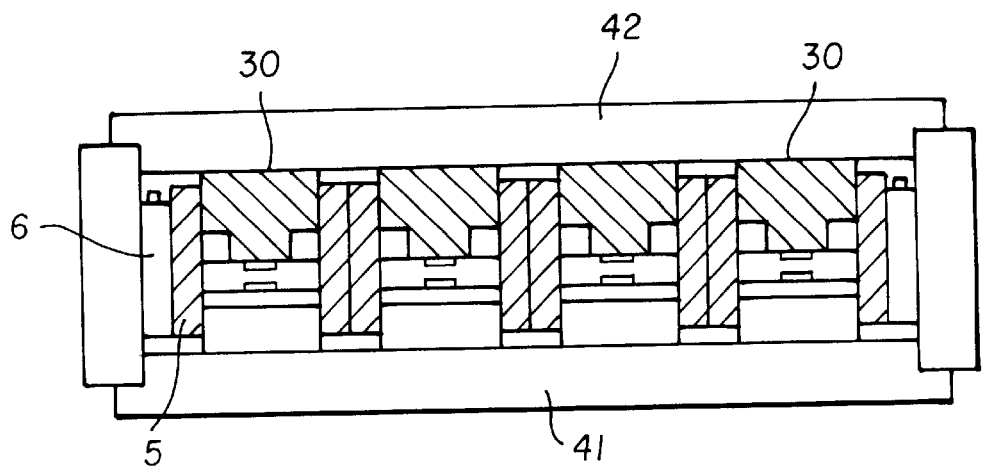
FIG. 1(a) is a cross sectional view showing the whole structure of a semiconductor device as one embodiment of the present invention.
Figure 1B:
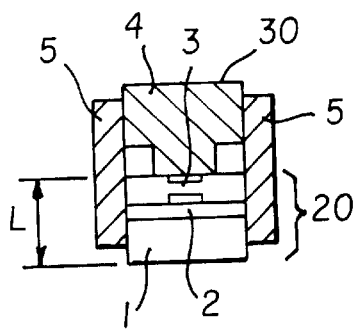
FIG. 1(b) is a cross sectional view showing each semiconductor unit of the semiconductor device of FIG. 1(a)
Figure 1C:
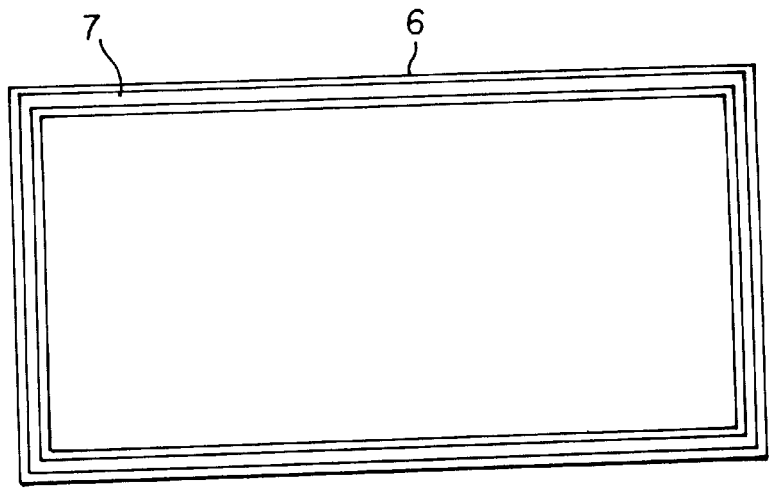
FIG. 1(c) is a plan view showing a frame in which the semiconductor units are accommodated.
Figure 2:
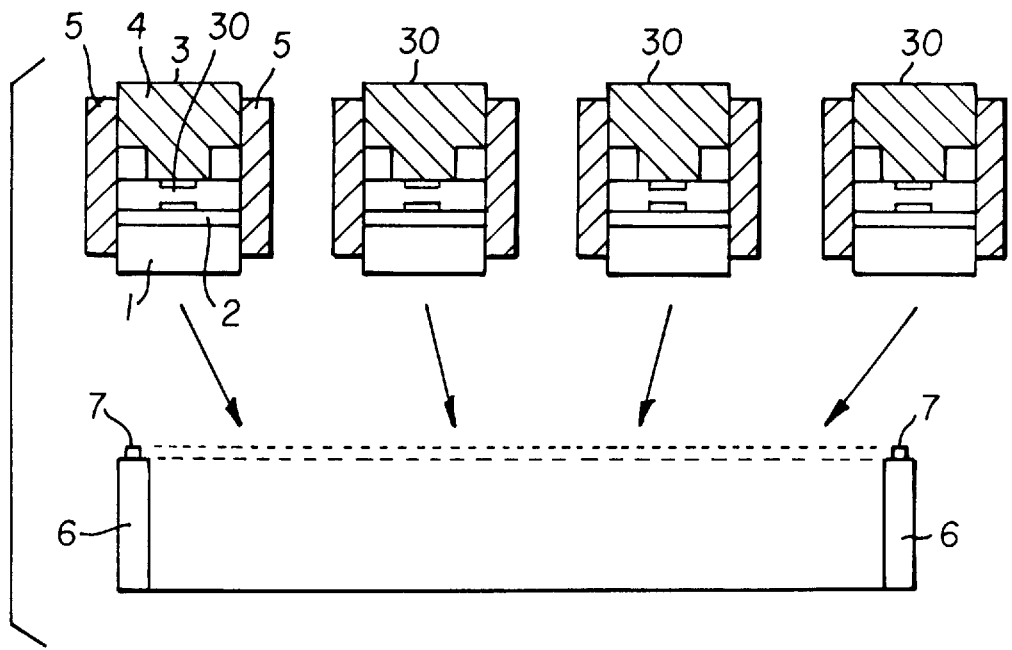
FIG. 2 is a view showing a manner in which the semiconductor units are incorporated into the frame to produce the semiconductor device of FIG. 1(a)
Figure 3:
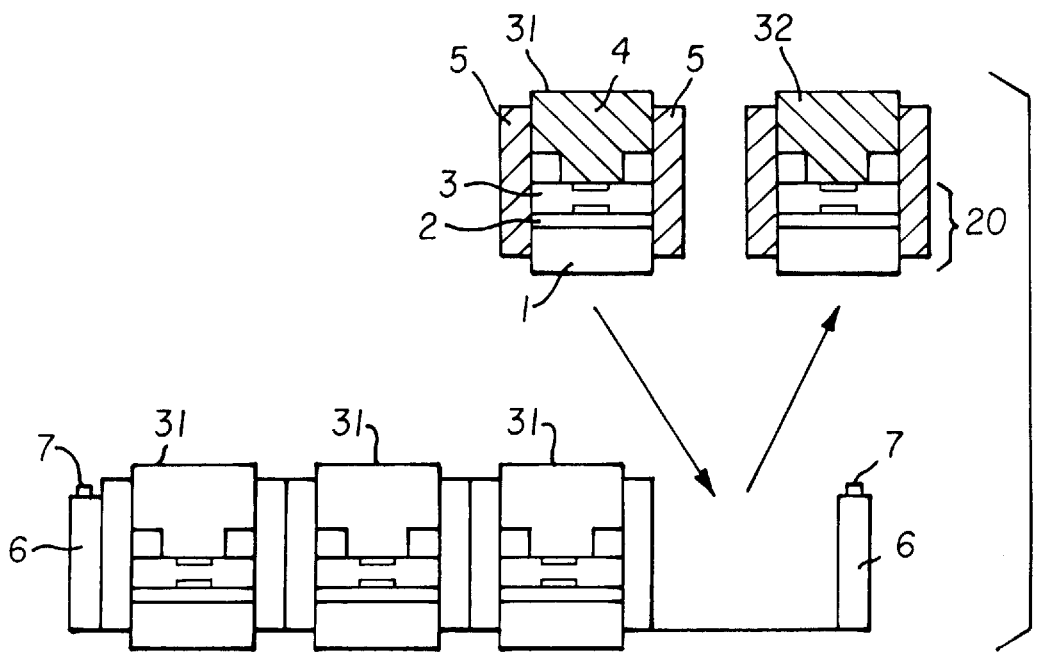
FIG. 3 is a view showing a manner in which a defective semiconductor unit is replaced by a non-defective semiconductor unit.

FIGS. 1(a)–1(c) are views showing a principal part of one embodiment of the present invention, wherein FIG. 1(a) is a cross sectional view of the whole structure, FIG. 2 is a cross sectional view of a semiconductor unit of this embodiment, and FIG. 3 is a plan view showing a frame in which a gate finger is formed. Four rectangular positioning guides 5 are fitted and positioned in an insulator frame 6 in which a gate finger 7 is formed, such that adjacent ones of the guides 5 are in contact with each other. Semiconductor element 20 and contact terminal block 4 are positioned by each of the positioning guides 5. The semiconductor element 20 consists of a semiconductor chip 3, a solder 2 as a binder, and a support plate 1. This semiconductor element 20, contact terminal block 4 and positioning guide 5 constitute a semiconductor unit 30. The contact terminal block 4, which is accurately positioned by the positioning guide 5, is in contact under pressure with a collecting electrode (not shown) formed on the semiconductor chip 3, and serves as a pressure body, conductor and heat radiator.

There will be explained a method for fabricating the semiconductor elements 20. A desired number of solder sheets 2, semiconductor chips 3 and contact terminal blocks 4 (which contact emitter electrodes 8 of the semiconductor chips 3) are placed on individual support plates 1 (metal plates, such as Mo plates, that are secured to collector electrodes 9 of the semiconductor chips 3) while being guided by the positioning guides 5 (made of heat-resistant plastic, such as liquid crystalline polymer or polyimide resin), and concurrently pressed by a flat metal plate at an elevated temperature. Thus, the thickness of each of the semiconductor elements 20 is controlled to the same value, by adjusting the thickness of the solder sheets 2 by means of a pressure soldering device, utilizing plastic deformation between the solid phase and liquid crystal of the solder at the elevated temperature. The thickness of each semiconductor element 20 is measured as a distance "L" between the surface of the emitter electrode (not shown) of the semiconductor chip 3 and the surface of the support plate 1. The above-indicated pressure soldering device is provided with a stopper that prevents the solder sheets 2 from undergoing further plastic deformation once the thicknesses of the semiconductor elements 20 are controlled to the same value. Consequently, each of the semiconductor units 30 has the same total thickness of the semiconductor element 20 and contact terminal block 4, and the semiconductor elements 20 are uniformly pressed by a pair of common electrode plates 41, 42 that contact the surfaces of the contact terminal blocks 4 and the surfaces of the support plates 1, respectively.

While the semiconductor device of the present embodiment has four semiconductor elements 20, the number of semiconductor elements may be changed depending upon the current capacity of the semiconductor device. The positioning guide 5 is desirably resistant to heat up to about 340° C. if the soldering temperature is 320° C., for example. A plurality of the thus formed semiconductor units 30 are fitted in the frame 6 having a rectangular or square shape. The gate finger 7 formed in the frame 6 is connected to gate pads of the semiconductor chips 3 by bonding wires (not shown), thereby to provide the semiconductor device.

FIG. 2 is a view showing how the semiconductor units 30 are assembled or incorporated into the frame 6. This figure shows a process in which four semiconductor units 30, in each of which the semiconductor element 20 and contact terminal block 4 are positioned by the positioning guide 5, are fitted into the frame 6 provided with the gate finger 7.

FIG. 3 is a view showing how a defective semiconductor unit 32 is replaced by a good or non-defective semiconductor unit 31. Namely, this figure shows the manner of repair in the case where a defective semiconductor unit appears after assembling the semiconductor units 30 with the frame 6. The defective semiconductor unit 32 including a defective semiconductor unit 20 is removed from the frame 6 provided with the gate finger 7, and the non-defective semiconductor element 31 including a non-defective semiconductor element is inserted into the portion of the frame 6 from which the above unit 32 is removed, such that the thickness of the non-defective semiconductor element is made equal to that of non-defective semiconductor elements of the other semiconductor units 31 by means of the pressure soldering device as described above. Thus, a non-defective semiconductor device is provided. Since the contact terminal block 4 is generally formed with extremely high accuracy, only the semiconductor element 20 may be replaced by another one.

While the semiconductor elements 20 constituting the semiconductor device are of gate control type, such as insulated gate type bipolar transistor, MOS control thyristor, and MOS transistor, the semiconductor elements 20 may include flywheel diodes that are disposed in parallel with and in reverse relationship with the above type of semiconductor elements 20.

In the semiconductor device of the invention in which a plurality of semiconductor elements are accommodated in the flat package, when one of the semiconductor elements constituting the semiconductor device becomes defective, it is replaced by a non-defective semiconductor element such that the element replacing the defective has the same thickness as other non-defective semiconductor elements remaining in the package, thus assuring a considerably increased yield of the semiconductor device.

Further, the plurality of semiconductor elements incorporated in the flat package are subjected to uniform pressure due to contact of their planes with the contact block and common electrode plates, and are able to dissipate heat from both of the main surfaces thereof, whereby the current capacity of the semiconductor device can be considerably increased. In addition, bonding wires are not used for drawing current from the main electrodes of the semiconductor elements, which leads to reduced inductance in the internal wiring of the device. Moreover, the plurality of semiconductor elements are accommodated in the flat package having a hermetically sealed structure, thus assuring significantly improved operating reliability.

What is claimed is:

1. A semiconductor device comprising:

a plurality of semiconductor chips, each semiconductor chip including a first electrode on a first main surface and a second electrode on a second main surface;

a plurality of support plates each of which is secured to said second main surface of a corresponding one of said semiconductor chips, said semiconductor chips and said support plates constituting individual semiconductor elements;

a flat package comprising first and second common electrode plates and an insulating sleeve interposed between the common electrode plates, said semiconductor elements being accommodated in said flat package such that said semiconductor chips and said support plates are positioned by positioning guides, said first common electrode plate being in contact under pressure with said support plates; and a plurality of contact terminal blocks each of which is disposed between said second common electrode plate and said first electrode of a corresponding one of said plurality of semiconductor chips, so as to apply a pressure to the corresponding semiconductor chip and serve as a conductor and a heat radiator.

2. A semiconductor device as defined in claim 1, wherein said semiconductor elements and said contact terminal blocks are positioned by said positioning guides.

3. A semiconductor device as defined in claim 2, wherein said positioning guides are formed of heat-resistant plastic.

4. A semiconductor device as defined in claim 3, wherein said heat-resistant plastic comprises one of liquid crystalline polymer and polyimide resin.

5. A semiconductor device as defined in claim 1, further comprising a binder applied between said second electrode of said each semiconductor chip and a corresponding one of said support plates, said binder having a thickness that is controlled so that said plurality of semiconductor elements accommodated in said flat package have the same thickness as measured as a distance between a surface of said first electrode of said each semiconductor chip and a surface of a corresponding one of said support plates.

6. A semiconductor device as defined in claim 5, wherein said thickness of said binder applied between said second electrode and the corresponding support plate is controlled when a defective semiconductor element is replaced by a non-defective semiconductor element, so that a thickness of said non-defective semiconductor element that replaces said defective semiconductor element becomes equal to that of other non-defective semiconductor elements.

7. A semiconductor device as defined in claim 1, wherein said flat package comprises a frame in which a gate finger is formed, and wherein said positioning guides are accurately positioned within said frame.

8. A semiconductor device as defined in claim 1, wherein said each semiconductor chip having the first electrode on the first main surface and the second electrode on the second main surface is selected from an insulated gate bipolar transistor, a MOS control thyristor and a MOS transistor, said semiconductor device further comprising at least one flywheel diode that is incorporated in said flat package and disposed in parallel with said plurality of semiconductor chips, and at least one contact terminal block disposed between said second common electrode plate and an anode electrode of each of said at least one flywheel diode so as to apply a pressure to said at least one flywheel diode and serve as a conductor and a heat radiator.

\* \* \* \* \*